(12) United States Patent
Stecher et al.

(10) Patent No.: US 7,276,803 B2
(45) Date of Patent: Oct. 2, 2007

(54) SEMICONDUCTOR COMPONENT AND METHOD FOR FABRICATING

(75) Inventors: Matthias Stecher, München (DE); Renate Hofmann, Regensburg (DE); Joerg Busch, Regensburg (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 10/953,922

(22) Filed: Sep. 29, 2004

(65) Prior Publication Data

US 2005/0127534 A1    Jun. 16, 2005

(30) Foreign Application Priority Data

Sep. 29, 2003   (DE)   ................. 103 45 247

(51) Int. Cl.
*H01L 23/52* (2006.01)
*H01L 23/48* (2006.01)
*H01L 29/40* (2006.01)

(52) U.S. Cl. .............. 257/781; 257/E23.092; 257/784; 257/786; 438/612

(58) Field of Classification Search ........ 257/E23.092, 257/719, 720, 675, 784, 787, 796, 705, 707, 257/779–781, 785, 786; 438/612
See application file for complete search history.

(56) References Cited

U.S. PATENT DOCUMENTS

| | | | | |
|---|---|---|---|---|
| 4,928,162 A | | 5/1990 | Lesk et al. ................. | 257/693 |
| 4,989,068 A | * | 1/1991 | Yasuhara et al. ........... | 257/788 |
| 5,041,902 A | * | 8/1991 | McShane ................... | 257/706 |
| 5,105,259 A | * | 4/1992 | McShane et al. .......... | 257/667 |
| 5,278,446 A | * | 1/1994 | Nagaraj et al. ............ | 257/707 |
| 5,289,039 A | * | 2/1994 | Ishida et al. ............... | 257/796 |
| 5,336,456 A | * | 8/1994 | Eskildsen et al. .......... | 264/157 |
| 5,455,462 A | * | 10/1995 | Marrs ....................... | 257/796 |
| 5,625,226 A | * | 4/1997 | Kinzer ...................... | 257/705 |
| 5,707,894 A | | 1/1998 | Hsiao ........................ | 438/614 |
| 5,753,969 A | * | 5/1998 | Suzuya et al. ............. | 257/667 |
| 5,846,874 A | | 12/1998 | Hartranft et al. .......... | 438/598 |
| 6,011,301 A | | 1/2000 | Chiu .......................... | 257/678 |
| 6,215,176 B1 | * | 4/2001 | Huang ....................... | 257/666 |

(Continued)

OTHER PUBLICATIONS

Efland, T, et al., "LeadFrameOnChip Offers Integrated Power Bus and Bond Over Active Circuit," Proceedings of 2001 International Symposium on Power Semiconductor Devices and ICs, Osaka, pp. 65-68 (2001).

(Continued)

*Primary Examiner*—Kenneth Parker
*Assistant Examiner*—Chris C. Chu
(74) *Attorney, Agent, or Firm*—Dicke, Billig & Czaja, PLLC

(57) ABSTRACT

Semiconductor components having a semiconductor body which includes a semiconductor base surface have to be sealed with a molding compound in order to protect against moisture or heat. Mechanical interlocking of the molding compound to the semiconductor base surface is achieved by means of at least one interlocking structure. This may be either a horizontal interlocking structure for mechanically interlocking the molding compound to the semiconductor base surface in the direction which is horizontal with respect to the semiconductor base surface and/or a vertical interlocking structure for mechanically interlocking the molding compound to the semiconductor base surface in the direction which is vertical with respect to the semiconductor base surface.

15 Claims, 12 Drawing Sheets

U.S. PATENT DOCUMENTS

| | | | |
|---|---|---|---|
| 6,316,835 B1 | 11/2001 | Chen et al. | 257/774 |
| 6,396,131 B1 * | 5/2002 | Kinsman et al. | 257/669 |
| 6,420,788 B1 | 7/2002 | Chen | 257/777 |
| 6,617,696 B1 | 9/2003 | Bendal | 257/780 |
| 6,800,932 B2 * | 10/2004 | Lam et al. | 257/706 |
| 6,933,619 B2 * | 8/2005 | Caletka et al. | 257/796 |
| 2002/0100969 A1 | 8/2002 | Farquhar | 257/717 |

OTHER PUBLICATIONS

Tachikawa, T., "Assembly and Packaging" ULSI Technoloyg, Chapter 10, pp. 530-586 (1996).

* cited by examiner

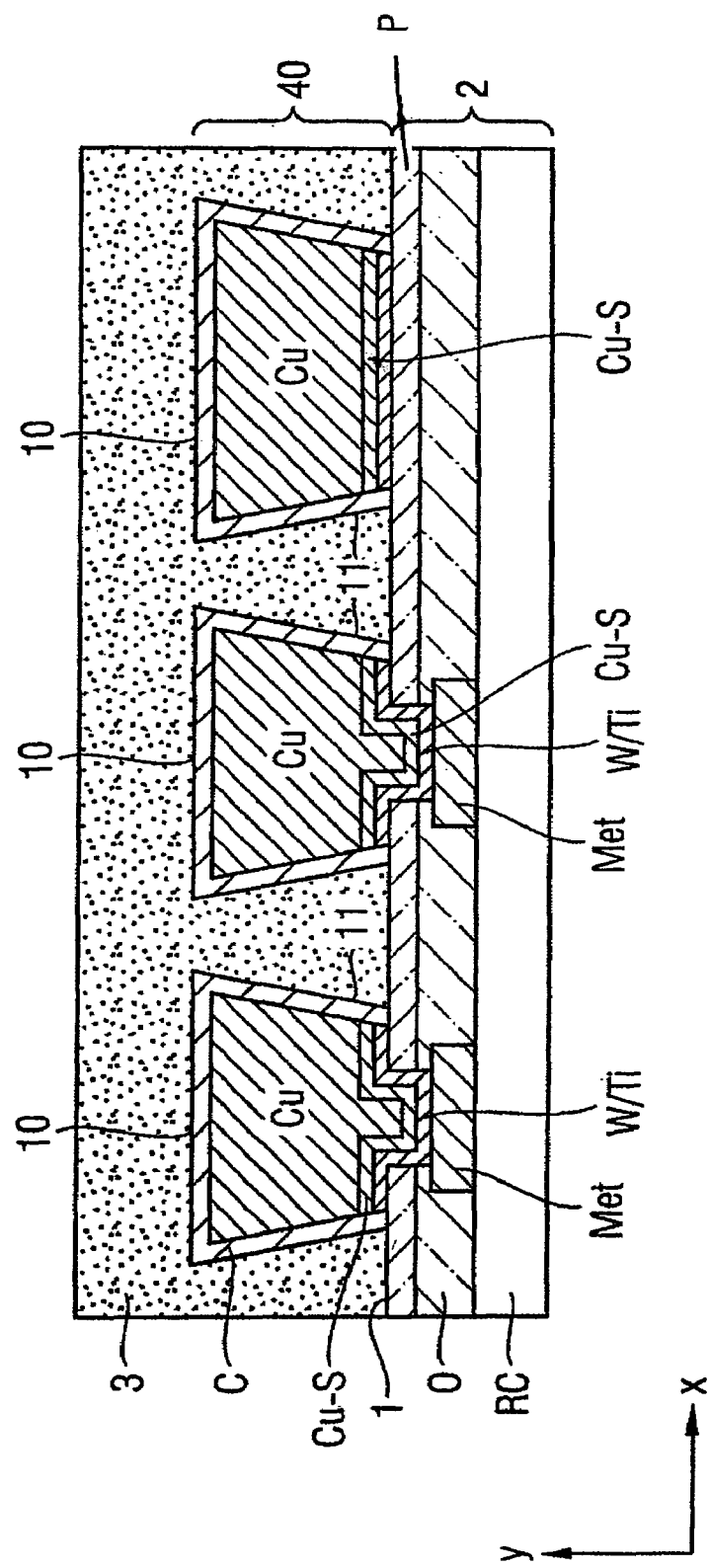

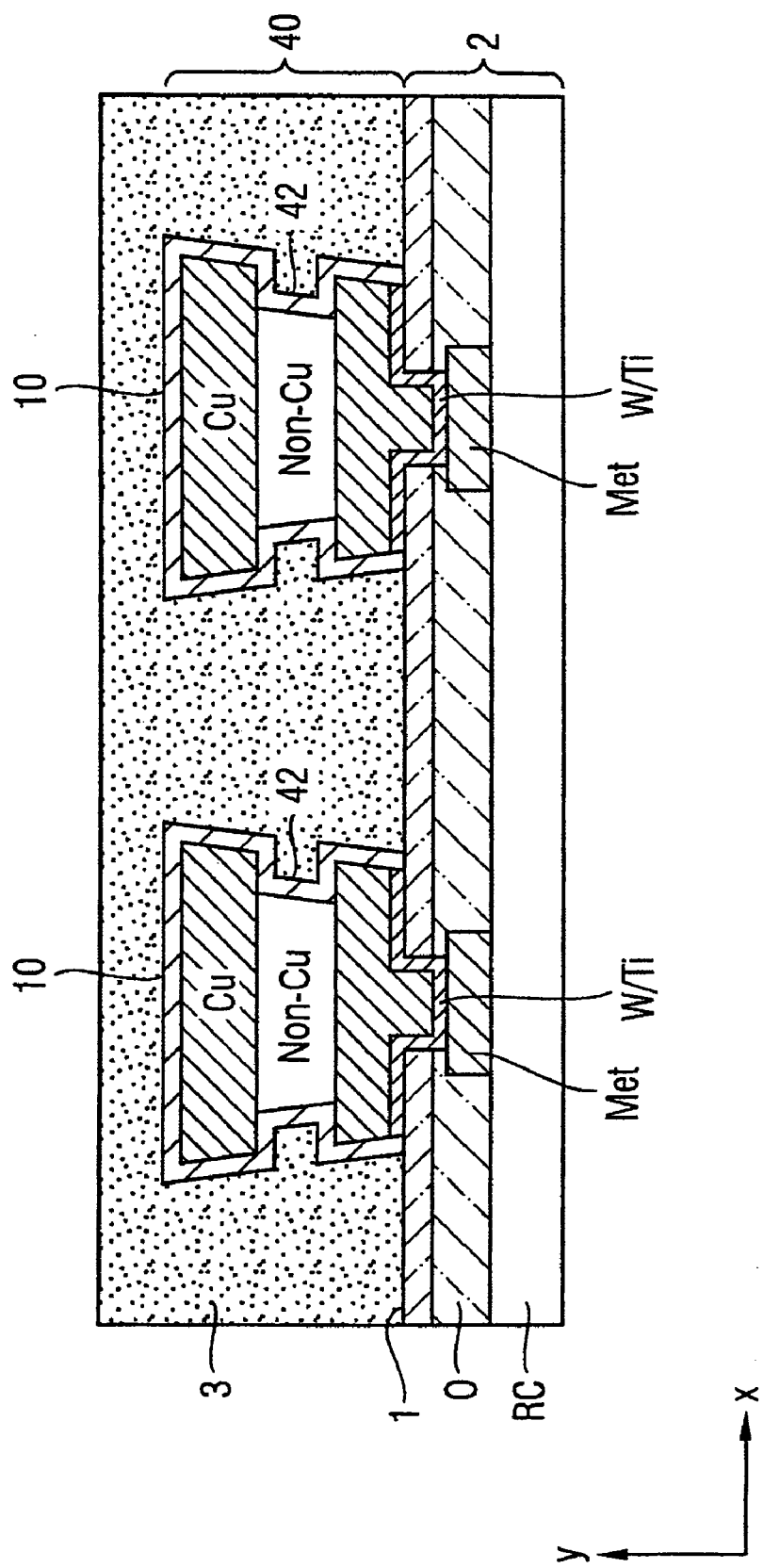

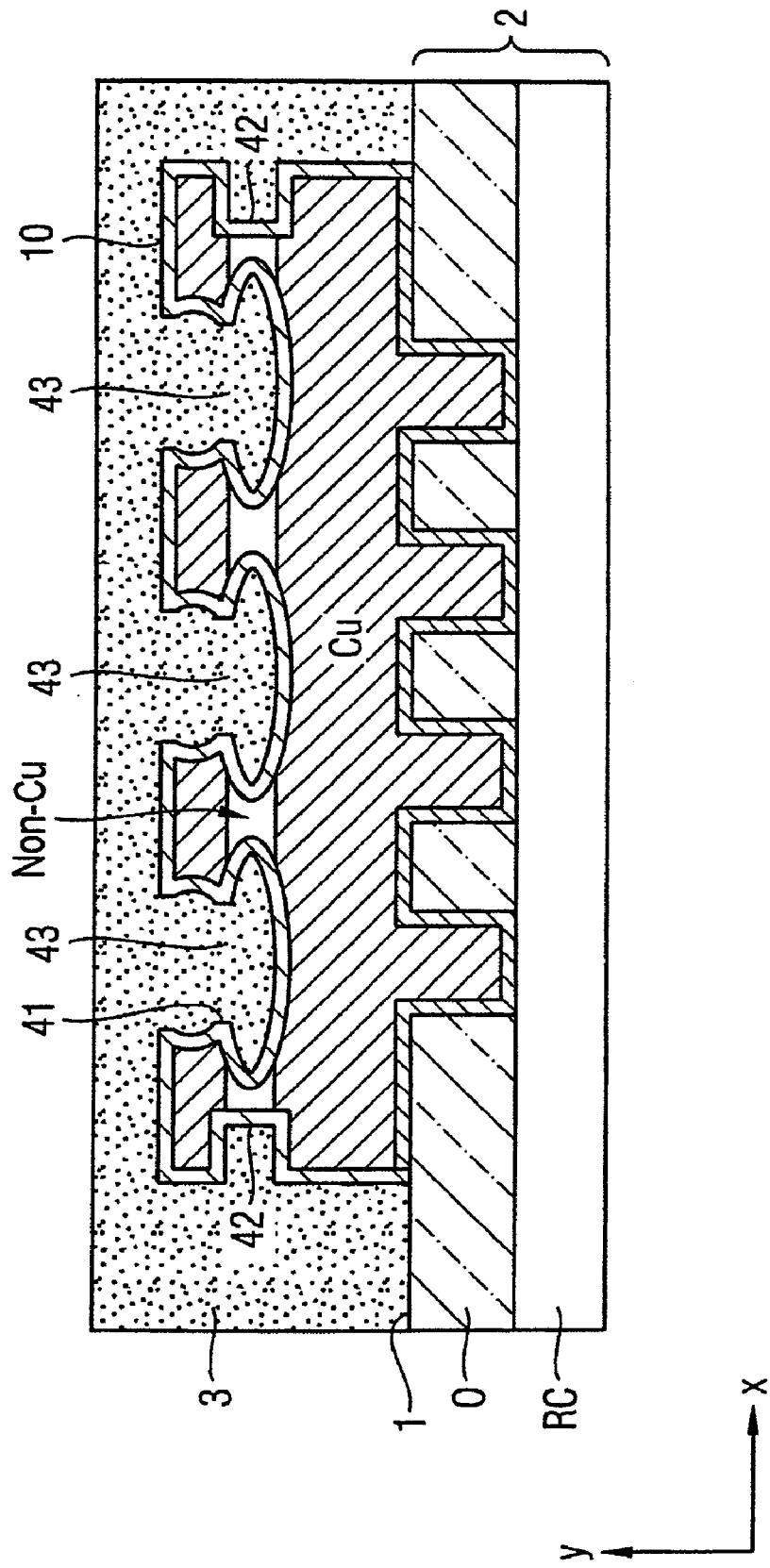

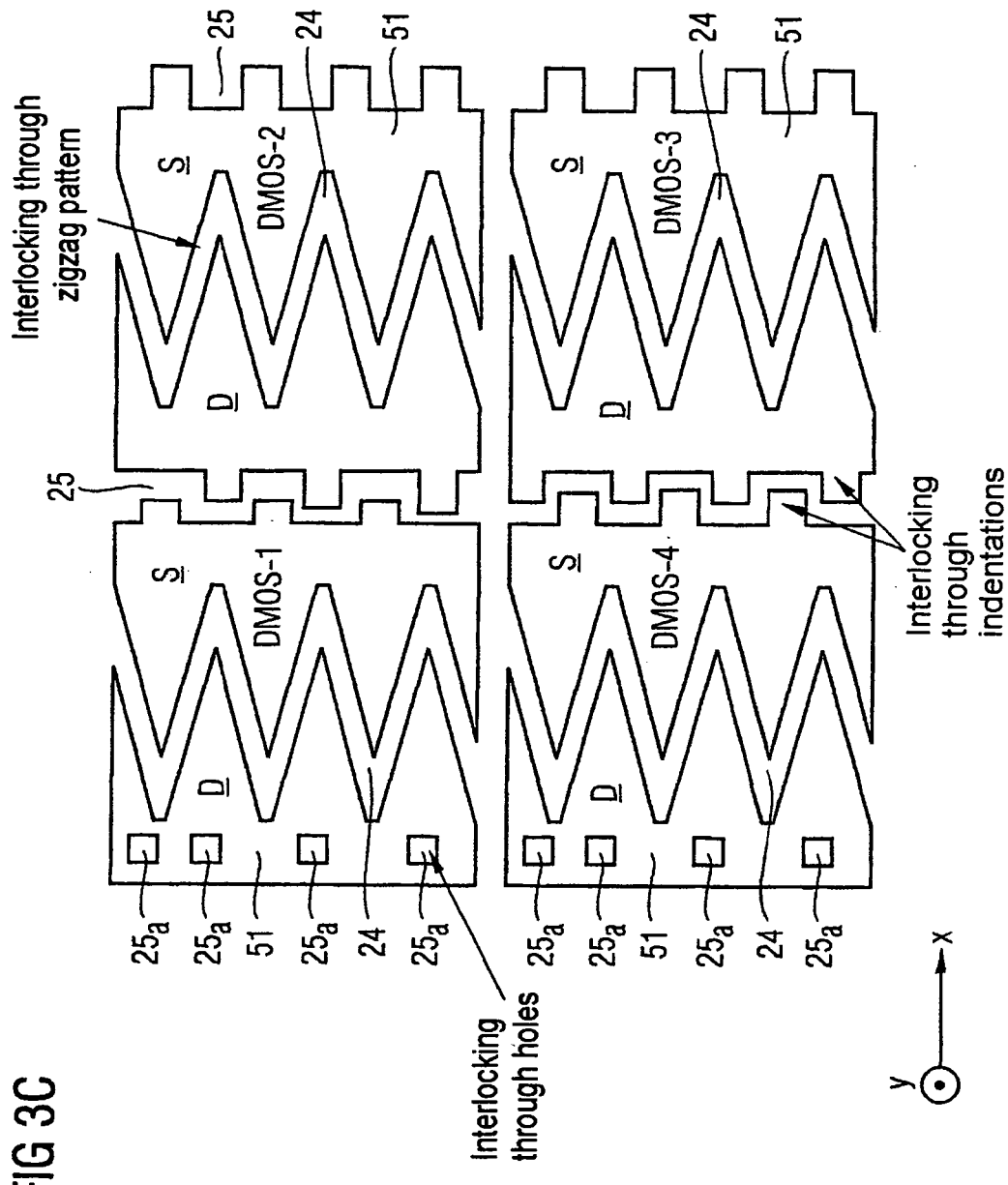

SEMICONDUCTOR COMPONENT AND METHOD FOR FABRICATING

CROSS-REFERENCE TO RELATED APPLICATIONS

This Utility Patent Application claims priority to German Patent Application No. DE 103 45 247.8, filed on Sep. 29, 2003, which is incorporated herein by reference.

BACKGROUND

The invention relates to a semiconductor component and to a method for fabricating a semiconductor component. Semiconductor components are used in a very wide range of fields and are in some cases exposed to a large number of unfavorable influences which can destroy the semiconductor component, such as for example heat, cold, moisture, etc.

Consequently, molding compound is used to seal a semiconductor body of a semiconductor component. However, this molding compound may become detached from the semiconductor body. This problem occurs to an increased extent in particular in the case of power technologies, in which very thick copper (>2 µm) is used instead of the layer of aluminum in order to improve the current-carrying capacity. The power metallization may in this case cover well over 50% of the surface area of the chip. To protect the copper from corrosion, the copper may be covered with an NiP/Pd/Au layer. This layer sequence also allows bonding using an Au nail head or an Al wedge.

FIGS. 1-0 to 1-7 illustrates the production of a chip of this type in a number of steps. In the basic process of FIG. 1-0, the oxide O is passivated P by means of sputtering and a Via2 etch to a metal layer Met2 is carried out. In the next step of FIG. 1-1, sputtering is carried out to produce a tungsten/titanium barrier W/Ti, followed by sputtering to produce a copper seed layer Cu-S. In the following step of FIG. 1-2, a negative resist L with a thickness of approx. 30 µm is applied by means of photographic technology. This is followed, in the next step of FIG. 1-3, by an electroplating process, in which copper Cu is applied with a thickness of, for example, approx. 20 µm. Then, the negative resist L is stripped, cf. step FIG. 1-4. In the step of FIG. 1-5, the barrier/seed layer, that is, the tungsten/titanium barrier W/Ti and the copper seed layer Cu-S are stripped, and in the step of FIG. 1-6, a coating C is applied over the copper Cu by means of autogenous electroplating. The bonding of the chip is illustrated in the step of FIG. 1-7.

It should be noted that throughout the following description, in each case identical reference symbols are used to denote identical layers or materials.

With chips or semiconductor components of this type, the problem arises that the housing molding compounds (also referred to below as molding compounds) have poor adhesion to precious metals, and therefore there is a high risk of the molding compound becoming detached or delaminated from the chip surface, that is, from the semiconductor base surface. The delamination of the molding compound from the chip surface is described, inter alia, in ULSI Technology; Chapter 10; C. Y. Chang, S. M. Sze, McGraw-Hill; ISBN 0-07-114105-7.

The delamination can cause the metallization and/or the chip passivation to be damaged, in particular in the event of fluctuating thermal loads. Moisture can collect at the delaminated chip surfaces and may lead, inter alia, to leakage currents and even short circuits between adjacent copper interconnects or components. Moreover, in the case of passivation cracks, the moisture may penetrate further into the chip, where it can lead to chip malfunctions. In other words, the semiconductor component is destroyed by the delamination, so that it is no longer guaranteed to be able to function.

If power copper is used, one possible way of avoiding the problems described above is for the molding compound to be matched to the chip passivation and to the uncovered metal layers, that is, to copper, in such a way that the molding compound bonds both to the uncovered metal layers, that is, the copper, and to the chip passivation. A procedure of this type is described, for example, in "Lead-FrameOnChip offers Integrated Power Bus and Bond over Active Circuit"; T Efland; Proceedings of 2001 International Symposium on Power Semiconductors Devices & ICs; Osaka; pp. 65-68, where the molding compound has to cover large areas of copper. Matching of the molding compound means that two different molding compounds, that is, the standard molding compound and the molding compound which is optimized for copper, have to be processed, which entails additional logistics costs and/or requires new molding machines in the back end.

Even the use of photoimide to improve the bonding between molding compound and chip, as is used for standard aluminum metallization, does not give any indication as to how to improve the bonding of the molding compound to the chip. If the topology of the power copper fluctuates extremely extensively, with height differences of >5 µm, the ability of this process used for standard aluminum metallization to be transferred to this application is very questionable. Firstly, the imide does not need to flow fully into all the trenches, resulting in the formation of cavities in which moisture can in turn accumulate. Secondly, the imide always has to be thermally cured in furnaces. Since layers comprising Au, Pd, Ni and Cu have already been applied to the wafers, dedicated furnaces have to be used in order to avoid cross-contamination with standard wafers. This would entail machinery investment costs. Furthermore, the imide has to be opened up again using an expensive photographic working step.

SUMMARY

One embodiment of the invention provides a semiconductor component in which the abovementioned drawbacks are avoided, in particular with regard to the bonding of a molding compound to a semiconductor body of the semiconductor component while ensuring that production is as inexpensive as possible.

A semiconductor component of the generic type has a semiconductor body with a semiconductor base surface, and a molding compound for sealing the semiconductor body. According to one embodiment of the invention, the semiconductor component has at least one interlocking structure for mechanically interlocking the molding compound to the semiconductor base surface, that is, an interlocking structure or an interlocking framework or a securing structure is applied to the semiconductor body and the molding compound can then interlock or hook to this structure. The interlocking structure may extend over the entire semiconductor base surface or alternatively only over certain parts of the semiconductor base surface.

In one embodiment, the interlocking structure is provided at the edges and/or in the corners of the semiconductor base surface, since this is where the expansion forces of the semiconductor body with respect to the molding compound are highest in the event of temperature fluctuations. It is demonstrated in ULSI Technology; Chapter 10; C. Y. Chang, S. M. Sze, McGraw-Hill; ISBN 0-07-114105-7 that the forces which are active between the molding compound and the semiconductor body in the event of temperature fluctuations increase exponentially at the edges and corners of the semiconductor base surface.

One embodiment of the invention applies suitable structures to the semiconductor base surface of the semiconductor body, in which structures the molding compound is mechanically interlocked or mechanically fixed, so that it can no longer become detached or delaminated from the semiconductor base surface. The interlocking structure in this case does not necessarily result from general design criteria, that is, the interlocking structure is deliberately configured in such a way that it achieves mechanical interlocking of the molding compound to the semiconductor base surface rather than using general, known existing structures on semiconductor bodies, such as for example known wirings or the like. Therefore, the deliberate configuration or formation of interlocking structures on the semiconductor body forms the subject matter of the embodiment of the invention, rather than any random mechanical securing of the molding compound to the semiconductor body resulting from design aspects, layout or the like of the chip.

The semiconductor component according to one embodiment of the invention has a horizontal interlocking structure for mechanically interlocking the molding compound to the semiconductor base surface in the direction which is horizontal with respect to the semiconductor base surface and/or a vertical interlocking structure for mechanically interlocking the molding compound to the semiconductor base surface in the direction which is vertical with respect to the semiconductor base surface. The horizontal interlocking structure prevents shifting or detachment of the molding compound with respect to the semiconductor base surface in the horizontal direction, and the vertical interlocking structure prevents shifting or detachment in the vertical direction. It should be noted that a horizontal shift and a vertical shift generally occur in combination, since it is generally the case that in the event of expansion caused by heat, force components occur in various directions with respect to the semiconductor base surface.

In one embodiment, the interlocking structure is formed by at least one interlock body which is fixedly joined to the semiconductor body. The fixed joining of the interlock body to the semiconductor body can be achieved, for example, as described above in connection with the production of a power copper level. This means that the fixed joining of the interlock body to the semiconductor body can be produced by means of known technologies or processes. Therefore, there is no need for additional steps to be employed to produce the fixed joins, and low-cost production is possible.

In an alternative embodiment, the interlocking structure is formed by an arrangement of a multiplicity of interlock bodies on the semiconductor base surface. This ensures horizontal interlocking and/or vertical interlocking of the molding compound to the semiconductor base surface over the entire semiconductor base surface of the semiconductor body. Consequently, any forces which occur can be distributed throughout the large number of interlock bodies. This means that each individual interlock body only has to absorb a small proportion of the forces occurring between the molding compound and the semiconductor body. Overall, therefore, the large number of interlock bodies are able to compensate for significantly stronger forces than just a small number of interlock bodies.

In some embodiments at least one interlock body and/or the large number of interlock bodies are arranged at the edge and/or in at least one corner of the semiconductor base surface. As has been mentioned above, strong expansion forces occur in particular at the edge and in the corners of the semiconductor base surface. Consequently, delamination occurs in particular at the edges and corners of semiconductor bodies, and this can be prevented by arranging the interlock bodies at the edge and/or in at least one corner in accordance with one embodiment of the invention.

Furthermore, in some embodiments the interlock bodies are at a short distance from one another, thereby boosting the mechanical interlocking.

The distances between the interlock bodies may be selected in such a way that their footprint in one embodiment covers at least 30% of the semiconductor base surface. It is also possible to deviate from this value of at least 30%: it may also be higher or lower depending on the chip size, molding compound and power metal coating.

The interlock body base surface, that is, the footprint of the interlock body (bodies) is in some cases substantially circular or elliptical, rectangular and/or triangular. These are just some possible forms of the footprint of the interlock body (bodies). Further possible forms can be found by the person skilled in the art without major outlay.

Furthermore, in some cases the footprint of the interlock body (bodies) has a zigzag pattern and/or indentations.

In some embodiments the zigzag patterns and/or the indentations of different interlock bodies to intermesh with one another, that is, for the interlock bodies with a zigzag pattern or indentations along the footprint of the interlock body (bodies) to be arranged in such a way that these interlock bodies engage or intermesh with one another.

In an alternative embodiment of the invention, the interlock body (bodies) form tracks on the semiconductor base surface, that is, the interlock bodies are designed to be thin and elongate in the horizontal direction.

Furthermore, the interlock bodies in some cases form a symmetrical or asymmetrical grid structure on the semiconductor base surface, that is, the tracks of the interlock bodies on the semiconductor base surface intersect one another so as to form a grid structure.

The tracks of the interlock body (bodies) on the semiconductor base surface may have a zigzag pattern, rectangular cutouts or rungs. Many other configurations and/or intersections of tracks formed by interlock bodies on the semiconductor base surface are conceivable and will result from simple considerations on the part of the person skilled in the art.

Furthermore, in some embodiments the interlock body (bodies) to have projections and/or indentations in the direction which is vertical with respect to the semiconductor base surface, that is, the interlock body (bodies) is/are as fragmented as possible, having a large number of projections, indentations, cracks, grooves, trenches, hollows or the like, so that the molding compound can be securely hooked into the interlock bodies. This configuration of the interlock body (bodies) is understood in the present context as a vertical interlocking structure.

The interlock body (bodies) may in this case have a single and/or multiple sandwich structure. A single or multiple sandwich structure makes it simple to produce projections, indentations or the like. In this case, by way of example, a sandwich formed from copper and another metal, such as for example zinc, nickel, silver, etc., is grown. On account of the differing selectivity of the wet-chemical route for different metals, the subsequent wet-chemical removal of the barrier/ seed layer complex results in steps in the blocks of metal, into which the molding compound can hook. Projections can be produced in a simple way by, for example, copper being applied over the photoresist (cf. the above description of the production of power copper structures), so that copper blocks or interlock bodies with projecting copper regions result. In the case of large cohesive copper regions, for example, several mm×mm, which occur, for example, with individual transistors, projections and/or indentations or the like can be produced by means of hole etching. The projections and/or indentations are formed by virtue of the metal block or interlock body being composed of a multiple sandwich and the individual metal layers or the layers of the interlock body have different wet-chemical selectivities. In this case, a mask can be used for the etching.

By means of the wet-chemical etch which has just been described, it is possible to produce crater-like indentations with or without protruding edges. However, it is also conceivable for the crater-like indentations to be produced in other ways. For example, as an alternative to the wet-chemical etch it is also possible to carry out a plasma etch, although this is more complex.

In an alternative embodiment, the semiconductor body has a circuit with a function, and the interlocking structure is at least partially functionally related to the function of the circuit, that is, the interlocking structure can be realized, for example, by required interconnects or the like; however, it is also possible for the interlocking structure to be applied to the semiconductor base surface of the semiconductor body in addition to existing lines or the like. Interlock bodies can therefore also be integrated in existing layouts of semiconductor components in a simple way without these components being altered as a result. In this case, it is merely necessary for interlock bodies to be applied between and/or around the existing lines, components or the like.

The interlocking structure may consist of a conductive material or a nonconductive material, that is, the material from which the interlocking structures are formed is not germane to the invention. In one embodiment the interlocking structure is formed by virtue of the interlock bodies being fixedly joined to the semiconductor body. However, interlocking structures which can be produced in a simple way without entailing major costs may be preferred, that is, interlock bodies are produced, for example, from materials which are in any case required for production of a specific semiconductor component.

In an alternative embodiment, the semiconductor body has at least one electronic component, and the interlocking structure at least partially forms the terminals of the at least one electrical component, that is, the terminals of a component may be formed as interlock bodies as described above. If a large number of terminals, interconnects and the like are formed as interlock bodies in the sense of the invention, it may be possible to dispense with the need for additional interlock bodies which have no functional relationship to the function of the circuit. This makes it possible to save space yet nevertheless to effectively prevent delamination.

The electronic component may, for example, be a transistor. In this case, the source, drain and/or gate connection may be formed as an interlock body in the sense of the invention.

The semiconductor body may also include a wiring and/or interconnects, the wiring at least partially forming the interlocking structure, that is, the wiring may be configured in such a way as to produce an interlocking structure according to one embodiment of the invention.

In one embodiment, the interlocking structure is formed from copper or a material similar to copper. Corresponding interlocking structures can be produced easily and inexpensively because there is no need for any additional materials. In the case of some power copper technologies, it is expedient for the interlocking structure to be formed from copper (Cu).

In a method according to one embodiment of the invention for fabricating a semiconductor component as described above, it is possible for an interlocking structure to be formed by means of an electroplating process. In this case, by way of example, copper can be applied over and beyond photoresist, so that the copper blocks which are formed have protruding copper regions. After the electroplating process, that is, after the electroplating or autogenous electroplating, the protruding copper regions are retained, resulting in the formation of an interlocking structure according to one embodiment of the invention, for example in the form of interlock bodies according to the invention.

In an alternative method for fabricating a semiconductor component as described above, a wet-chemical etch is used to form an interlocking structure. In this case, by way of example, protruding edges are produced in a multiple sandwich using a mask through which the etch is carried out (cf. above).

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2A illustrates copper blocks or power copper blocks with negative flank angles.

FIG. 2C illustrates a sandwich structure with indentations.

FIG. 2D illustrates a multiple sandwich with protruding edges which has been produced by means of a wet-chemical etch.

FIG. 3C illustrates an arrangement according to the invention of various DMOS transistors.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIGS. 2A to 2D illustrate various vertical interlocking structures 40, that is, interlocking structures in a section which is vertical with respect to the semiconductor base surface 1.

FIGS. 2A to 2D each illustrate a system of coordinates, in which the x axis shows a direction referred to below as horizontal direction x and runs parallel to a semiconductor base surface 1. The y axis shows a direction referred to below as vertical direction y and runs perpendicular to the semiconductor base surface 1.

Figures 0, 1:
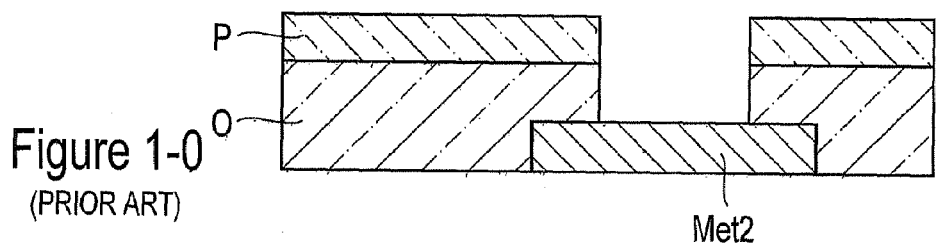
FIGS. 1-1 to 1-7 illustrates the process sequence involved in the production of a power copper level (prior art).
Figure 1:
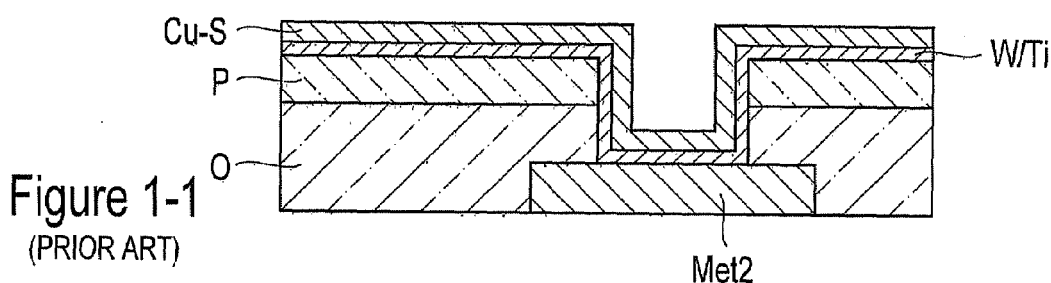
Figures 1, 2:
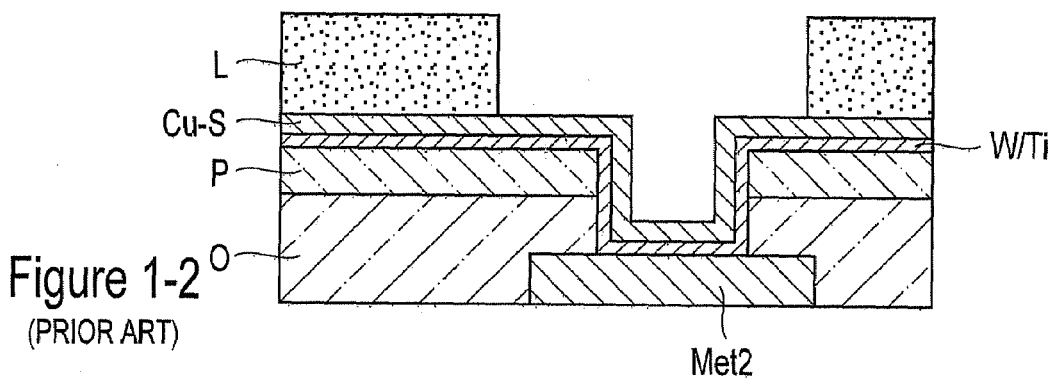

FIG. 2A illustrates interlock bodies 10 made from copper Cu which are secured to a semiconductor base surface 1 of a semiconductor body 2. The copper Cu is surrounded by a coating C. Furthermore, the figure illustrates a tungsten/titanium barrier W/Ti, via which the copper Cu is fixedly joined to the semiconductor body 2. The semiconductor body 2 comprises a passivation layer P, oxide O and a remaining chip RC.

The two interlock bodies 10 shown on the left-hand side in FIG. 2A are electrically connected to the remaining part of the chip or the remaining chip RC in the semiconductor body 2 via a metal layer Met in the oxide of the semiconductor body 2 and can therefore perform functions of the chip or the semiconductor component. The interlock body 10 illustrated on the right-hand side of FIG. 2A, by contrast, is not connected to the remaining chip RC via a metal layer and is used only as an interlock body without any electrical function. In exceptional cases, by way of example, the interlock body 10 illustrated on the right-hand side may also be an electrical line which is connected anywhere on the chip and therefore at least has a defined potential. This line may also if appropriate be connected at two locations on the chip and therefore carry current.

Furthermore, FIG. 2A illustrates molding compound 3 which surrounds the interlock bodies 10 for sealing purposes. By way of example, the molding compound used may be epoxy resin; this may in one case be provided with grains of silicone. However, other materials are also possible. The interlock bodies 10 have negative flank angles 11. The negative flank angles 11 result in mechanical interlocking in the vertical direction y. In particular if the interlock bodies 10 are arranged closely adjacent to one another, that is, with a short distance between them in the direction x, as illustrated in FIG. 2A, the result is interlocking of the molding compound with the interlock bodies 10 or the semiconductor body 2. The molding compound 3 is therefore clamped between the interlock bodies 10. The distances between the interlock bodies should approximately correspond to the interlock body thickness. However, they may also be slightly less than this thickness. In some cases, these distances should be as short as possible.

Figure 2B:
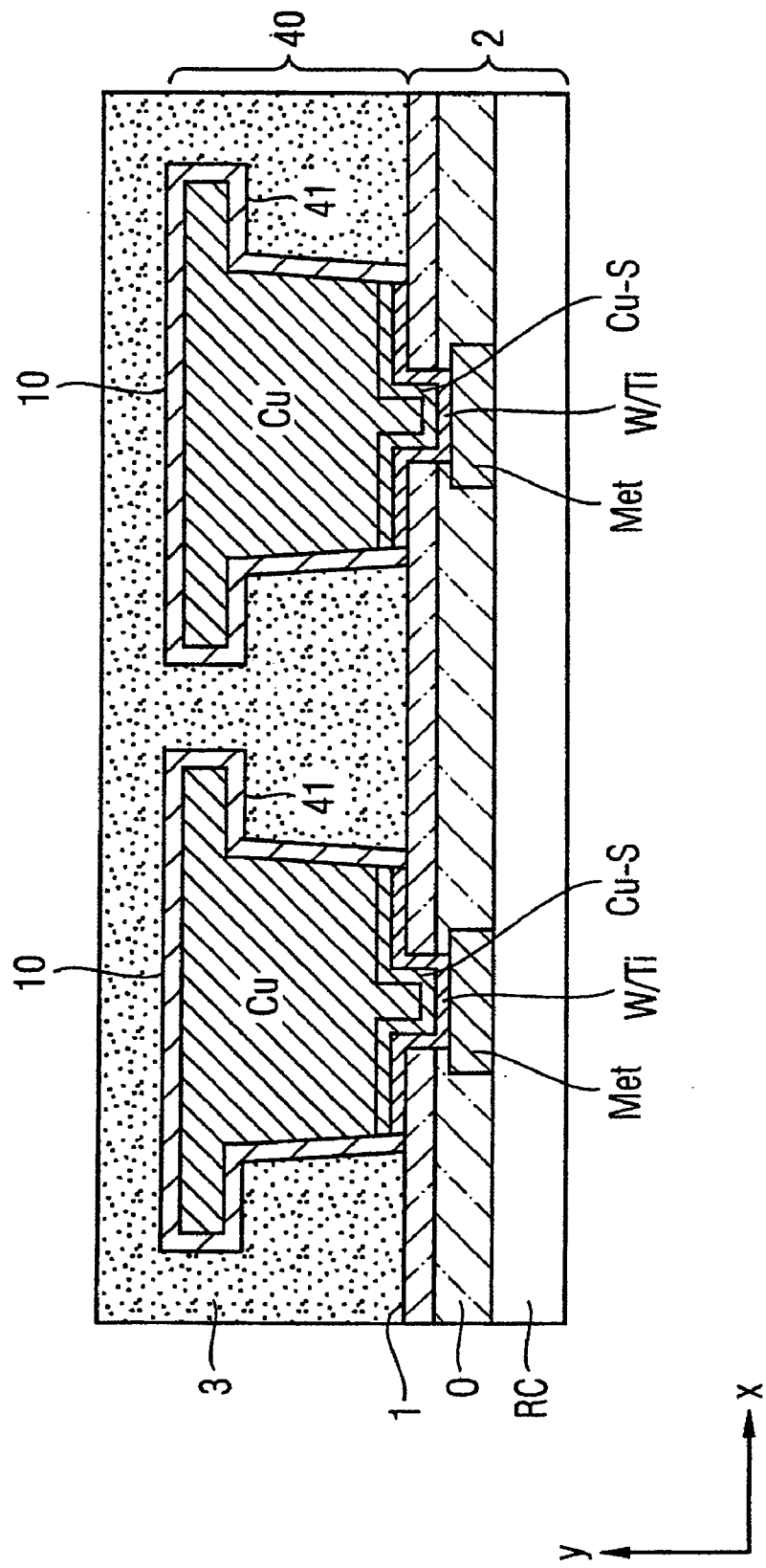
FIG. 2B illustrates copper blocks with projections or protruding regions.

FIG. 2B illustrates a vertical interlocking structure 40, which can be produced at low cost, comprising interlock bodies 10 formed from copper with projections 41. To produce the projections 41, during the electroplating process of step (1-3) from FIG. 1, copper is applied over and beyond the negative resist. During the subsequent stripping of the negative resist L, the projections 41 remain in place. The protruding regions or projections 41 clamp the molding compound in the trenches which form.

FIG. 2C illustrates vertical indentations 42 in a vertical section through the interlock bodies 10. The figure illustrates a multiple sandwich structure, with the indentations 42 being produced by means of a wet-chemical etch. The differing wet-chemical selectivity of the various metal layers results in the formation of the vertical indentations 42. Projections in the vertical direction in a multiple sandwich structure (not shown here) can also easily be produced in the same way. In this case, the metal between the two copper layers Cu, that is, the non-Cu metal, would form a vertical projection.

FIG. 2D illustrates a further vertical interlocking structure, in which protruding edges are produced by a wet-chemical etch in a multiple sandwich. A mask is used, and the wet-chemical etch is therefore carried out at certain predetermined locations on the surface of the multiple sandwich structure. The wet-chemical etch via a mask results in crater-like indentations 43 with vertical projections 41. The molding compound 3 can interlock or hook into the crater-like indentations 43. In addition, vertical indentations 42 result at the edges of the multiple sandwich structure. The reason for this is once again the differing wet-chemical selectivity of the various metal layers, which in this case are formed from copper Cu and non-copper non-Cu. Non-Cu materials of this type are materials which have a good conductivity and a different wet-chemical selectivity than copper. Examples include Ni, Co, Sn, Ag, etc.

FIGS. 3A to 3J illustrate various horizontal interlocking structures 20 for mechanical interlocking in the plane of the drawing x.

Figure 3A:
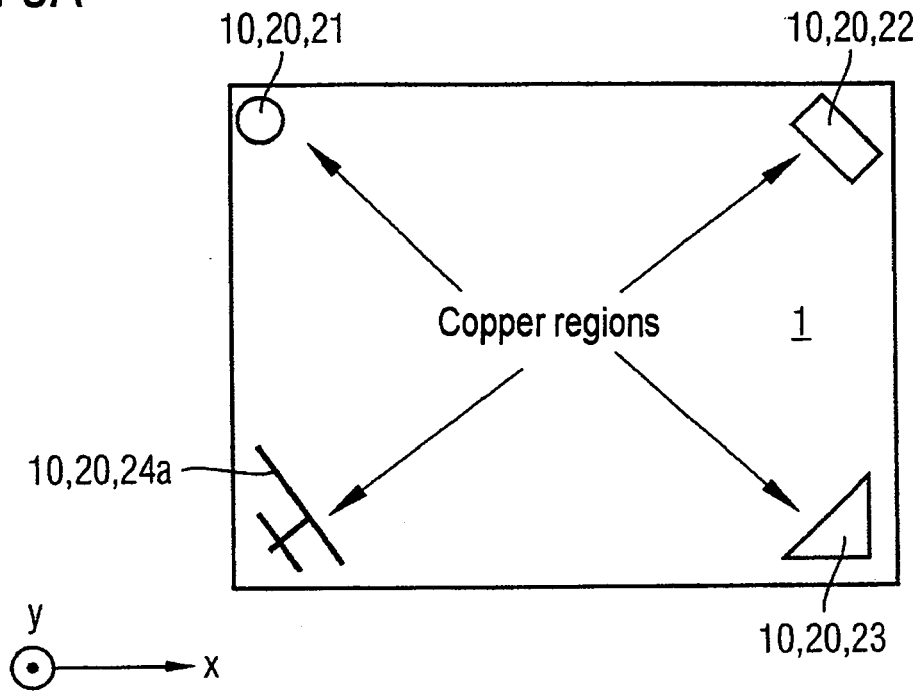
FIG. 3A illustrates various possible footprints of interlock bodies which are arranged at the corners of the base surface of a semiconductor body.

FIG. 3A illustrates various possible forms of footprints of interlock bodies 10. The interlock bodies are each arranged in a corner of the semiconductor base surface 1. In the top left-hand corner there is a circular interlock body 21 having a circular footprint, in the top right-hand corner there is a rectangular interlock body 22 with a rectangular footprint, in the bottom right-hand corner there is a triangular interlock body 23 with a triangular footprint, and in the bottom left-hand corner there is an antenna-like interlock body 24a, which is formed by two parallel interconnects with an interconnect running transversely with respect to them.

It should be noted that all the interlock bodies in FIG. 3A, that is, the circular interlock body 21, the rectangular interlock body 22, the triangular interlock body 23 and the antenna-like interlock body 24a, can be combined with all the possible vertical interlocking structures illustrated in FIGS. 2A, 2B, 2C and 2D. It should also be noted that the interlock bodies from FIG. 3A and the interlock bodies described below in FIGS. 3B to 3J can be combined with other vertical interlocking structures which are not shown here. According to one embodiment of the invention, it is also possible to use a horizontal interlocking structure from FIGS. 3A to 3J with known vertical interlocking structures. In other words, it is possible to arrange interlock bodies as illustrated in FIGS. 3A to 3J on the base surface 1 of the semiconductor body 2, these interlock bodies taking a form, for example, corresponding to FIGS. 2A to 2D in the y direction in the plane perpendicular to the base surface 1. In the case of the corner interlocking structures illustrated in FIG. 3A, it is also possible to use just one type of interlocking (circle, rectangle, etc.).

Figure 3B:
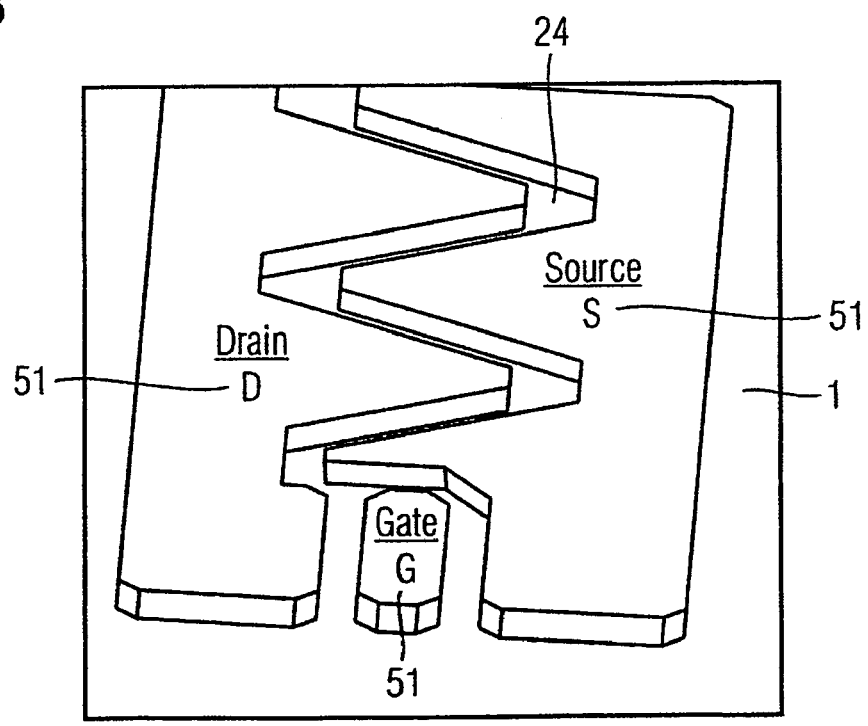
FIG. 3B illustrates a plan view of an MOS transistor according to the invention with a size of 1 mm×2 mm.

FIG. 3B illustrates a transistor 51 having a drain D, a source S and a gate G. Drain D and source S have a zigzag pattern 24. Drain D and source S are arranged in such a way that the zigzag pattern of the drain D and the zigzag pattern of the source S are intermeshed or overlap or engage in one another. If the transistor 51 is then sealed with molding compound 3, the molding compound is fixedly joined or interlocked to the transistor 51 or the semiconductor base surface 1.

Figures 1, 2, 3:
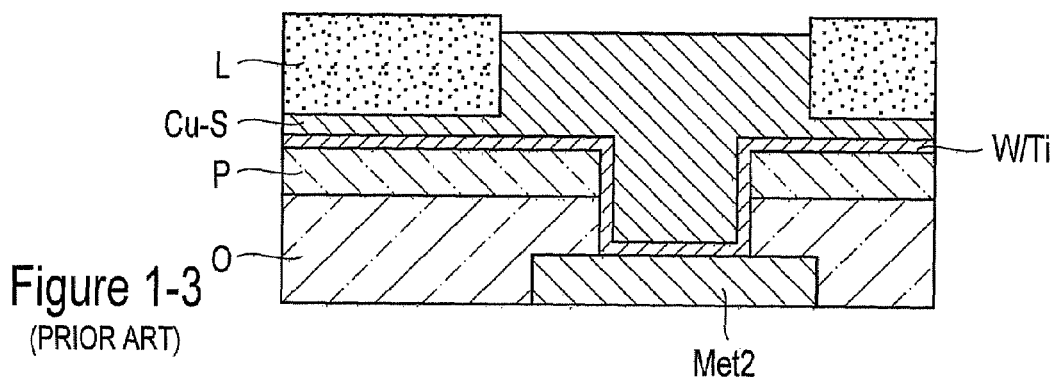
Figures 1, 2, 3, 4:
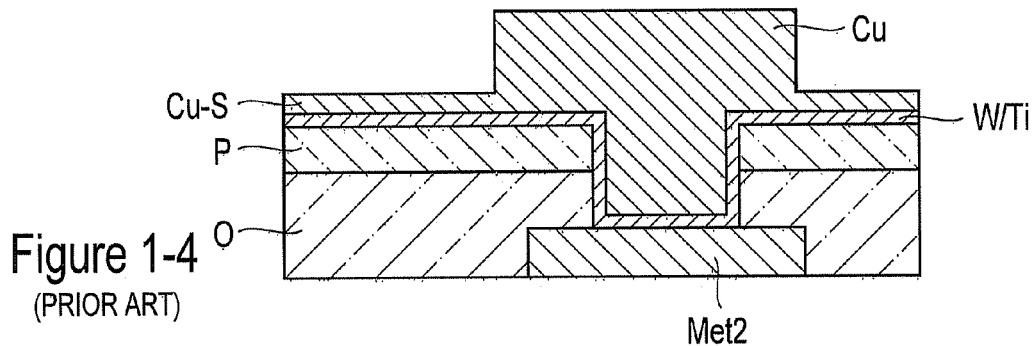
Figures 1, 2, 3, 4, 5:
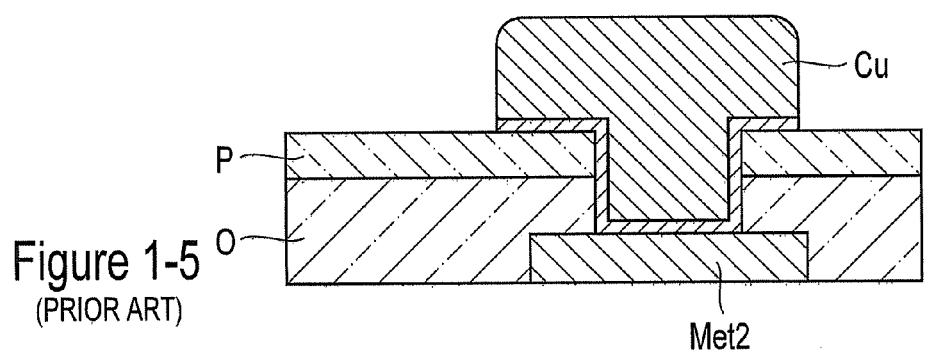
Figures 1, 2, 3, 4, 5, 6:
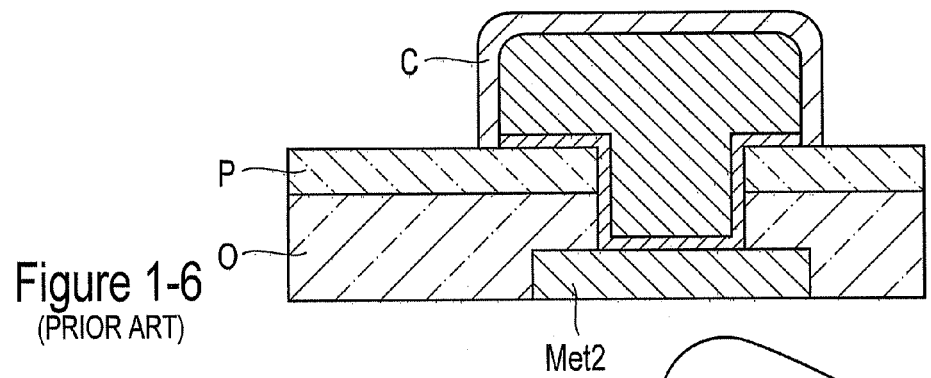
Figures 1, 2, 3, 4, 5, 6, 7:
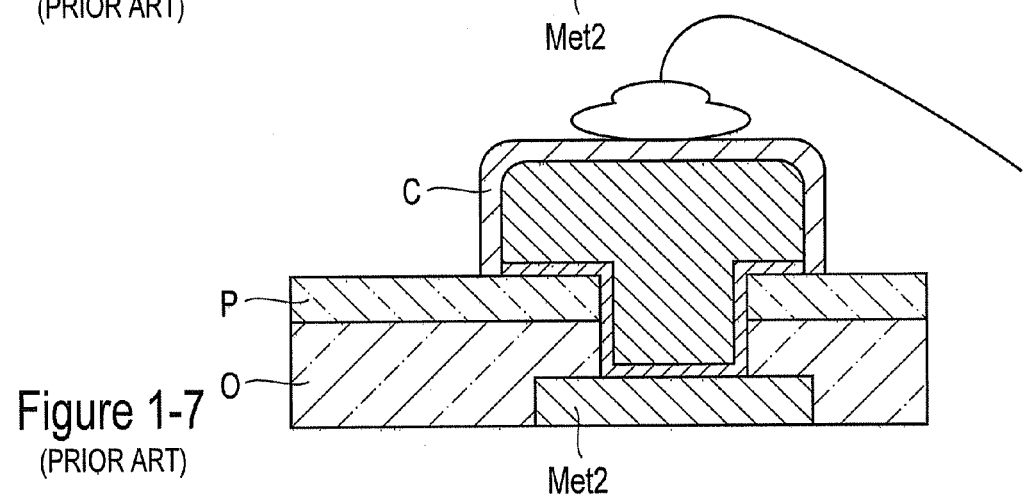

FIG. 3C illustrates an arrangement of four transistors 51, in which drain D and source S each have a zigzag pattern 24, as in FIG. 3B. The zigzag patterns 24 of the drains D and sources S are in each case intermeshed with one another. The transistors 51 illustrated in FIG. 3C are DMOS transistors.

The sources S of the transistors 51 illustrated in FIG. 3C each have projections and indentations 25. In addition, the two drains D of the transistors 51 illustrated on the right-hand side have indentations and projections 25 on one side. The indentations and projections of the sources S of the two left-hand transistors are arranged in such a way that they intermesh with the projections and indentations 25 of the two drains of the right-hand transistors. This results in interlocking of the transistors.

There are holes 25a in the two drains D of the transistors illustrated on the left-hand side in FIG. 3C. In FIG. 3C, the holes are rectangular, although other shapes are conceivable, for example triangular holes or round holes. After the transistors 51 illustrated in FIG. 3C have been sealed with molding compound 3, the zigzag patterns 24, the indentations and projections 25 and the holes 25a result in a strong mechanical join between the molding compound 3 and the transistors 51 or the semiconductor base surface 1. In this case too, it should be pointed out once again that the various horizontal interlocking structures illustrated in FIG. 3C can be combined with any vertical interlocking structure from FIGS. 2A to 2D.

Figure 3D:
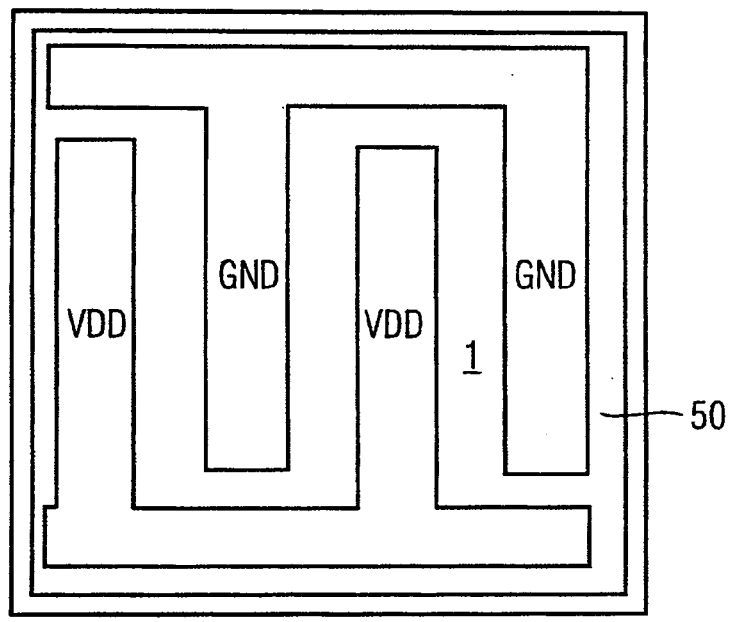
FIG. 3D illustrates interlocking structures in the logic region of a chip.

FIG. 3D illustrates a further embodiment of the invention, in which interlocking structures are illustrated in the logic region of a chip or semiconductor component. A circuit 50, which may be a logic or analog circuit, is arranged on the base surface 1. A ground line GND and a voltage supply line VDD have rectangular indentations. The ground line GND and the voltage supply line VDD are arranged in such a way that in each case projections of one line are intermeshed with the indentations in the other line.

Figure 3E:
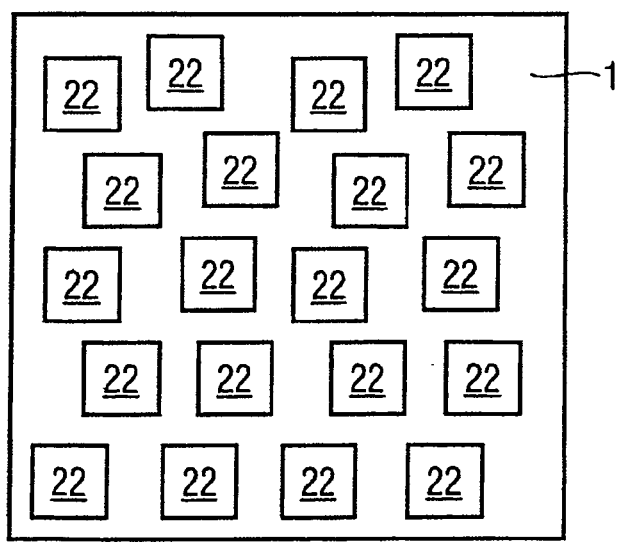
FIG. 3E illustrates interlocking structures in a chip or the semiconductor base surface of a semiconductor body outside the power MOS or logic region.
Figure 3F:
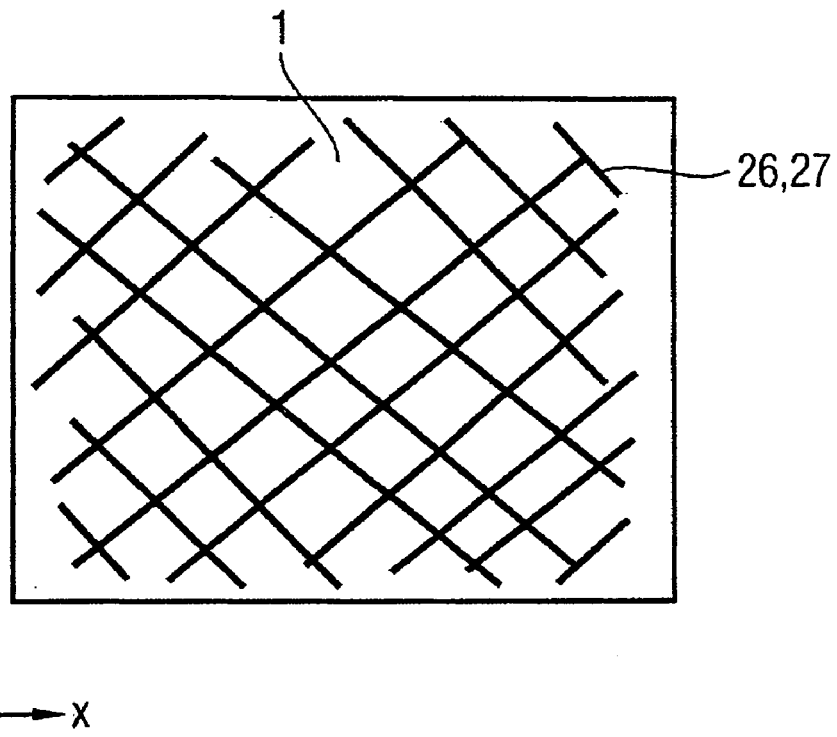
FIG. 3F illustrates a mesh or grid of short-circuited interconnects.

FIG. 3E illustrates interlocking structures on the semiconductor base surface 1 outside the power MOS or logic region, that is, the rectangular interlock bodies 22 illustrated in FIG. 3F are not functionally related to a circuit of the semiconductor component. They serve merely to improve the mechanical interlocking of the molding compound 3 to the rectangular interlock bodies 22 or the semiconductor base surface 1 and the semiconductor body 2. The rectangular interlock bodies 22 are arranged offset with respect to one another, resulting in improved interlocking.

FIG. 3F illustrates interlock bodies which run in tracks 26. A plurality of tracks 26 crossing one another results in a grid structure 27 or a network of short-circuited interconnects. Mechanical interlocking can also be achieved by means of this grid structure 27.

Figure 3G:
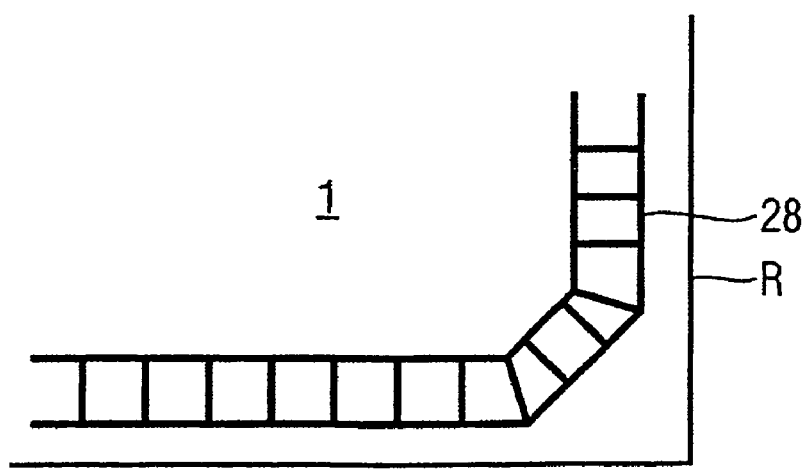
FIG. 3G illustrates interconnects along the edge of the semiconductor base surface with rectangular cutouts.

FIG. 3G illustrates tracks with rectangular cutouts 28 which run along the edge R of the semiconductor base surface 1. As has already been mentioned, the mechanical interlocking is significant at the edges and in the corners of the semiconductor base surface 1, since this is where strong forces occur. The rectangular cutouts in the interconnect along the edge R of the semiconductor base surface 1 result in mechanical interlocking.

Figure 3H:
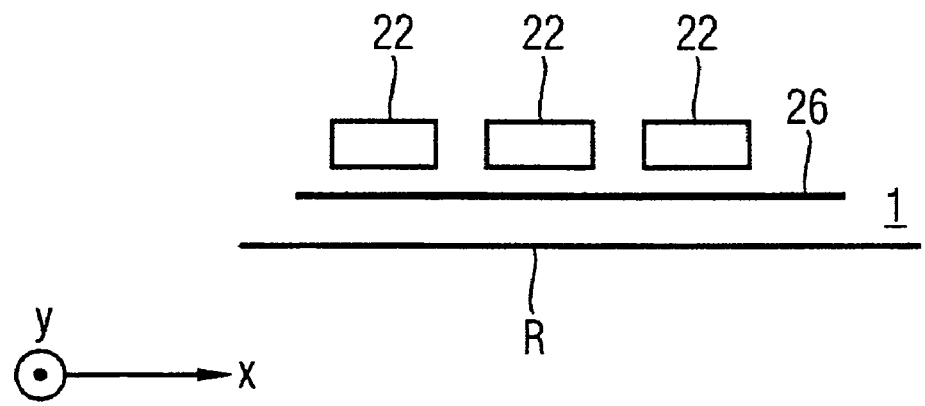
FIG. 3H illustrates the arrangement of rectangular interlock bodies along the edge of the semiconductor base surface.

FIG. 3H illustrates a further possible embodiment of the invention, in which rectangular interlock bodies 22 are arranged in front of an interconnect 26. The advanced rectangular interlock bodies 22 allow the force acting on the interconnect 26 to be minimized. This arrangement also leads to interlocking of the molding compound in the vertical direction. This is because if the distance between the rectangular interlock bodies is selected to be sufficiently short, the molding compound can no longer slip out vertically if, for example, the structures illustrated in FIGS. 2A to 2D are employed.

Figure 3I:
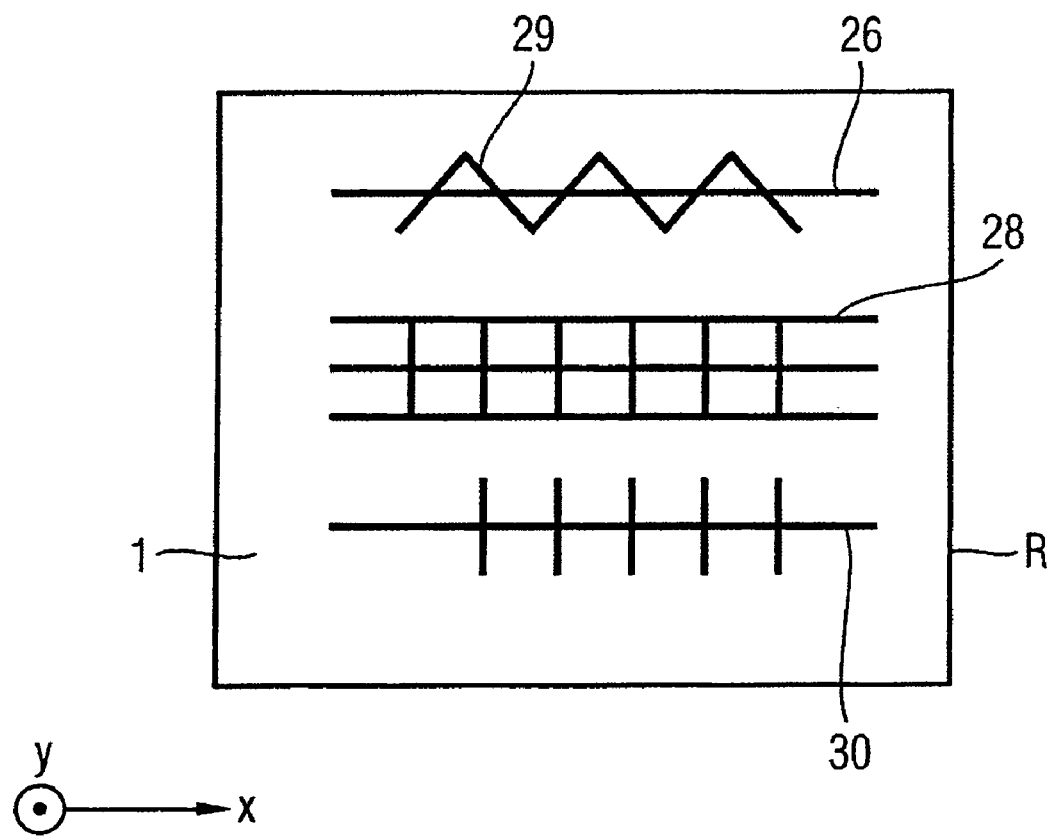
FIG. 3I illustrates further possible interlocking structures along an interconnect.

FIG. 3I illustrates further possible forms of interlocking structures. In the upper part of FIG. 3J, an interconnect 26 runs parallel to the edge of the semiconductor base surface 1 and is crossed by a track zigzag pattern 29. Three interconnects, which are crossed by interconnects running at right angles to them, run parallel to one another in the middle part of FIG. 3J. This results in an interconnect with rectangular cutouts 28. The lower part of FIG. 3I illustrates an interconnect which is intersected by short conductor sections running at right angles to it, resulting in an interconnect with rungs 30.

Figure 3J:
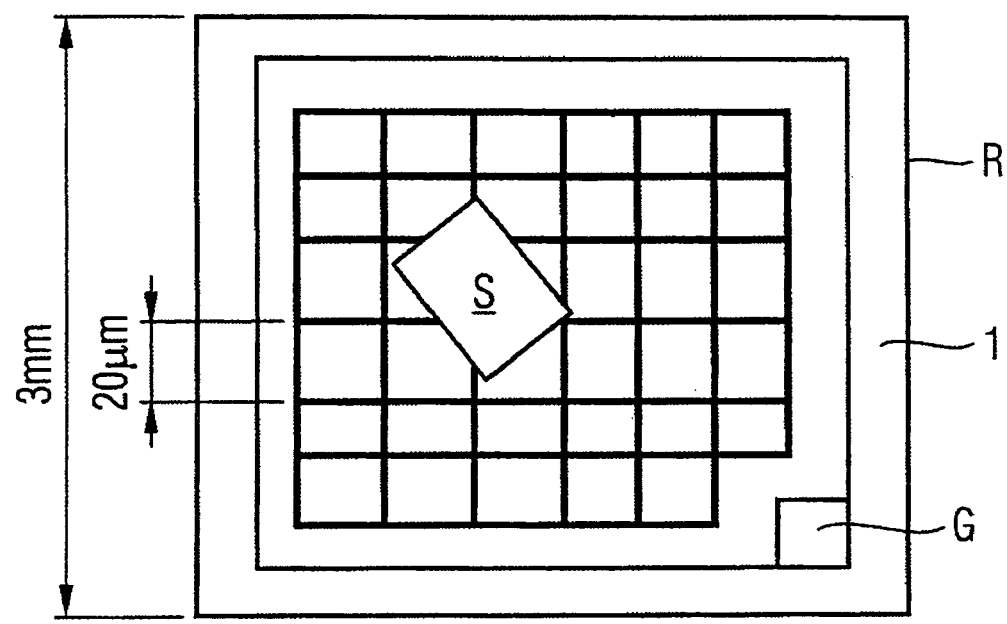
FIG. 3J illustrates an interlocking structure for a single-transistor DMOS.

FIG. 3J illustrates an interlocking structure for a single-transistor DMOS. In this case, the source S of the transistor is provided with rectangular cutouts which, by way of example, are approx. 20 μm×20 μm in size. A rectangular interlock body (pad), which is arranged diagonally with respect to the grid pattern resulting from the rectangular cutouts, is provided for connection of the source S of the single-transistor DMOS. The interconnects which form the grid pattern are electrically connected to the rectangular interlock body or pad and therefore to the interconnects which form the grid pattern. The pad may, for example, be used for connection of the sources. The gate G of the transistor runs along an interconnect around the source S. A square interlock body or pad for connection of the gate G is provided in the bottom right-hand corner.

It should be pointed out once again that any horizontal interlocking structure from FIGS. 3A to 3J can be combined with any vertical interlocking structure from FIGS. 2A to 2D. It is also possible not to use a vertical interlocking structure, that is, to produce interconnects and/or components in accordance with the prior art and to use a horizontal interlocking structure as illustrated in FIGS. 3A to 3J. Conversely, it is also possible not to use a horizontal interlocking structure, but rather only a vertical interlocking structure as illustrated in FIGS. 2A to 2D. It should also be noted that the horizontal and vertical interlocking structures merely represent examples of many other possible interlocking structures which will become clear to the person skilled in the art upon simple consideration.

There will now follow further information which may be of use to gain an understanding of certain embodiments of the invention.

The molding compound is vertically interlocked to the chip by the negative side flanks of the interlock bodies 10 illustrated in FIG. 2A. In some such embodiments, the copper blocks are closely adjacent, for example at a distance of a few μm from one another, and are dispersed over the entire chip. If the distribution of the copper blocks covers the entire chip, the lateral forces between molding compound and chip caused by the differing coefficients of thermal expansion are minimized. In some embodiments, the copper interconnects are as narrow and close together as possible. Consequently, passivation cracks or metal interconnect shifts can no longer occur. With high, that is, large, negative flank angles, it is possible to dispense with the need to match the molding compound.

In one embodiment of the invention, mechanical interlocking of the molding compound with the chip occurs in the vertical and horizontal directions by metal lines which project strongly upward, combined with a tight distribution of metal blocks over the entire chip. A further embodiment applies a single or multiple stack or sandwich comprising different metals, leading to steps at the end of the process sequence. In the case of large cohesive metal areas, it is possible to use an additional mask for the wet-chemical etching of recesses (cf. FIG. 2D). The interlocking ensures that the molding compound cannot become delaminated from the chip. Furthermore, the virtually complete coverage of the chip with copper bodies minimizes the lateral tensile and compressive forces, so that the chip passivation does not crack. There is no need for the copper bodies to carry current or to have a potential applied to them. This means that it is possible to apply copper bodies or interlock bodies which serve only for interlocking and do not realize any of the chip functions to the chip.

The following text provides a resume of several exemplary embodiments of the invention with reference to the figures.

1.) FIG. 3A illustrates a number of possible interlocking structures in the chip corners, where the tensile and compressive forces between chip and molding compound are highest. In some embodiments, this should be quite sufficient for small chips.

2.) FIG. 3B illustrates an interlocking structure which has been realized for a power DMOS (the size of the DMOS is approximately 1 mm$^2$), which has been selected in such a way that the on resistance and the electromigration requirements are fulfilled. The zigzag routing of the source and drain metallization allows interlocking in both directions.

3.) FIG. 3C illustrates a possible copper layout in the case of a motor bridge (4 DMOS transistors). The holes and indentations lead to further interlocking. The holes and indentations may be distributed over either the entirety of or only part of the DMOS structures. The holes and indentations may be of any desired form but in some applications should all be as close together as possible.

4.) FIG. 3D illustrates a metallization distribution in the digital/analog part of the chip, which is also used for electrical supply to the circuit.

5.) FIG. 3E illustrates a possible metallization layout. The copper right angles can also be replaced by squares, circles, star shapes, ellipses or other regular or irregular structures. They may also be of altogether different size.

6.) FIG. 3F illustrates a possible layout with rectilinear copper tracks. Curved copper tracks and copper tracks which do or do not cross one another are also conceivable.

7.) With the chips, it is normally necessary for potentials, such as for example ground, to be distributed via a metal line at the periphery of the chip. This line is of course subject to very high tensile and compressive forces in particular in the corners of the chip. To minimize the action of these forces on the line, by way of example it is conceivable for it to be routed as illustrated in FIG. 3G. The ladder-like routing allows the molding compound to interlock between the copper tracks, so that the forces along the line are minimized. It is also conceivable for a plurality of copper strands to be added to this ladder structure. It is also possible for the cross-struts to be extended over the actual copper tracks.

8.) FIG. 3H illustrates a possible copper track routing with copper regions ahead of them, minimizing the transverse forces acting on the copper track. The advanced copper regions may be of any desired configuration. There is no need for a regular structure. In the chip corners, these structures should be designed suitably for the forces prevailing there.

9.) FIG. 3I illustrates possible interconnect routings on the chip. The interconnect struts lead to the desired interlocking.

10.) FIG. 3J illustrates a possible interlocking structure for a single-transistor DMOS or a common-drain DMOS.

A combination of any desired number of the structures illustrated in FIGS. 3A to 3J is possible. The copper regions should expediently also perform electrical functions, but do not necessarily have to do so. In the latter case, they would have at least one connection made by a via to the lower metallization levels of the chip. This prevents them from adopting any potential during operation. If the copper bodies are not interlocked to the chip by the vias, the process has to ensure that they are sufficiently well bonded to the chip passivation. Moreover, the copper structures and the copper coating may be replaced by structures of any material and any coating. It is also conceivable to omit the coating. The interlocking effect achieved can be boosted still further by the interlocking bodies being covered with a layer which increases the ability to bond to the molding compound.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
   a semiconductor body having a semiconductor base surface;
   a molding compound for sealing the semiconductor body; and
   at least one interlocking structure for mechanically interlocking the molding compound to the semiconductor base surface;
   wherein the interlocking structure is formed by at least one interlock body that is fixedly joined to the semiconductor body;
   wherein the footprint of the interlock body has a zigzag pattern and indentations; and
   wherein the zigzag patterns and the indentations of different interlock bodies intermesh with one another.

2. The semiconductor component of claim 1, further including a horizontal interlocking structure for mechanically interlocking the molding compound to the semiconductor base surface in a direction that is horizontal with respect to the semiconductor base surface.

3. The semiconductor component of claim 1, further including a vertical interlocking structure for mechanically interlocking the molding compound to the semiconductor base surface in a direction that is vertical with respect to the semiconductor base surface.

4. The semiconductor component of claim 1, wherein the interlocking structure is formed by an arrangement of a multiplicity of interlock bodies on the semiconductor base surface.

5. The semiconductor component of claim 1, wherein the at least one interlock body is arranged at the edge of the semiconductor base surface.

6. The semiconductor component of claim 1, where the at least one interlock body is arranged in one corner of the semiconductor base surface.

7. The semiconductor component of claim 1, wherein the interlock bodies are at a short distance from one another, thereby boosting the mechanical interlocking.

8. The semiconductor component of claim 1, wherein the distances between the interlock bodies are selected in such a way that their footprint covers at least 30% of the semiconductor base surface.

9. The semiconductor component of claim 1, wherein the footprint of the interlock body is substantially a shape selected from a group consisting of circular, elliptical, rectangular, and triangular.

10. The semiconductor component of claim 1, wherein the interlock body form tracks on the semiconductor base surface.

11. The semiconductor component of claim 1, wherein the interlock bodies form a symmetrical grid structure on the semiconductor base surface.

12. The semiconductor component of claim 1, wherein the interlock bodies form an asymmetrical grid structure on the semiconductor base surface.

13. The semiconductor component of claim 1, wherein the interlock bodies form tracks on the semiconductor base surface with a track zigzag pattern.

14. The semiconductor component of claim 1, wherein the interlock body has indentations in a direction that is vertical with respect to the semiconductor base surface.

15. The semiconductor component of claim 1, wherein the interlock body has projections in a direction that is vertical with respect to the semiconductor base surface.

* * * * *